(12) United States Patent
Lee

(10) Patent No.: US 7,331,799 B1
(45) Date of Patent: Feb. 19, 2008

(54) STACKED ELECTRONIC COMPONENT AND FASTENING DEVICE THEREOF

(75) Inventor: Ming-Tsung Lee, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 0 days.

(21) Appl. No.: 11/626,985

(22) Filed: Jan. 25, 2007

(30) Foreign Application Priority Data

Oct. 16, 2006 (TW) .............................. 95138133 A

(51) Int. Cl.
*H01R 12/00* (2006.01)
(52) U.S. Cl. ..................... 439/68; 439/83; 439/500; 439/698; 439/620.24; 361/309; 361/308.1; 361/306.3
(58) Field of Classification Search ................ 439/68, 439/69, 83, 500, 698, 620.24, 620.25; 361/760, 361/301.4, 309, 308.1, 306.3
See application file for complete search history.

(56) References Cited

U.S. PATENT DOCUMENTS

| | | | | |
|---|---|---|---|---|
| 4,346,429 A | * | 8/1982 | DeMatos | ..................... 361/310 |
| 6,191,933 B1 | * | 2/2001 | Ishigaki et al. | ............. 361/309 |
| 6,201,683 B1 | * | 3/2001 | Yamada et al. | .......... 361/308.1 |
| 6,574,089 B1 | * | 6/2003 | Moriwaki et al. | ....... 361/306.3 |
| 6,924,967 B1 | * | 8/2005 | Devoe | ..................... 361/301.4 |

\* cited by examiner

*Primary Examiner*—Tho D. Ta
(74) *Attorney, Agent, or Firm*—Kirton & McConkie; Evan R. Witt

(57) ABSTRACT

A stacked electronic component includes multiple energy storage units and a fastening device. Each energy storage unit has a first electrode and a second electrode. The fastening device includes first and second fastening member disposed on opposite sides of the energy storage units. Each of the first and second fastening members includes a body plate, at least a clamping structure extending from two edges of the body plate and at least a connecting part electrically connected to the body plate and the circuit board. The energy storage units are clamped by the clamping structures of the first and second fastening members and the first and second electrodes are electrically connected to the body plates of the first and second fastening members, so that the first and second electrodes are electrically connected to the circuit board through the body plates and the connecting parts of the first and second fastening members.

20 Claims, 12 Drawing Sheets

STACKED ELECTRONIC COMPONENT AND FASTENING DEVICE THEREOF

FIELD OF THE INVENTION

The present invention relates to an electronic component, and more particularly to a stacked electronic component. The present invention also relates to a fastening device of the stacked electronic component.

BACKGROUND OF THE INVENTION

With increasing of electronic industries, the electronic devices are developed toward minimization, high operating speed and increasing integration level. Due to the reduced size, many electronic components are packaged in a stacked form. Take a capacitor for example. For increasing the capacitance and reducing the layout area of the capacitor on the circuit board, a stacked capacitor was developed.

Referring to FIG. 1, a schematic cross-sectional view of a conventional stacked capacitor is illustrated. The stacked capacitor 1 is disposed on a circuit board 2 and includes two energy storage units 10. Each energy storage unit 10 includes a first electrode 101 and a second electrode 102 at bilateral sides thereof. The stacked capacitor 1 further includes a first metallic terminal 11 and a second metallic terminal 12. The first electrodes 101 of these two energy storage units 10 are bonded to the first metallic terminal 11 via a soldering material 13 such that these two first electrodes 101 are electrically connected to each other. Similarly, the second electrodes 102 of these two energy storage units 10 are bonded to the second metallic terminal 12 via the soldering material 13 such that these two second electrodes 102 are electrically connected to each other. The bottom surfaces of the first metallic terminal 11 and the second metallic terminal 12 are fixed on the circuit board 2 via a soldering material 14 according to a surface mount technology. Accordingly, the first electrodes 101 and the second electrodes 102 of the energy storage units 10 are electrically connected to the circuit board 2 through the first metallic terminal 11 and the second metallic terminal 12.

During the process of welding the first electrodes 101 and the second electrodes 102 of these two energy storage units 10 to the first metallic terminal 11 and the second metallic terminal 12, the first electrodes 101 need to be precisely aligned with the first metallic terminal 11 and/or the second electrodes 102 need to be precisely aligned with the second metallic terminal 12. If the alignment is not proper, the amount of the soldering material 13 is insufficient and thus the solderability of the soldering material 13 is unacceptable. Under this circumstance, the first metallic terminal 11 and the second metallic terminal 12 fail to be firmly bonded to the energy storage units 10. In addition, since the stacked capacitor 1 is mounted on the circuit board 2 via the soldering material 14 according to a surface mount technology, the soldering material 13 between the first electrodes 101 and the first metallic terminal 11 and/or the soldering material 13 between the second electrodes 102 and the second metallic terminal 12 may be molten during the reflowing process. Therefore, the energy storage units 10 are not electrically connected to the first metallic terminal 11 and/or the second metallic terminal 12.

During operation, the stacked capacitor 1 may generate energy in the form of heat, which is readily accumulated and difficult to dissipate away. Under this circumstance, the circuit board 2 is readily suffered from thermal expansion. Due to a thermal expansion coefficient difference between the stacked capacitor 1 and the circuit board 2, the energy storage units 10 are possibly cracked. Since the structure of the stacked capacitor 1 is damaged, the stacked capacitor 1 fails to operate normally.

In views of the above-described disadvantages resulted from the conventional method, the applicant keeps on carving unflaggingly to develop an electronic component and a fastening device thereof according to the present invention through wholehearted experience and research.

SUMMARY OF THE INVENTION

It is an object of the present invention to provide fastening device for facilitating fixing the stacked electronic component and making electrical connection between the energy storage units and a circuit board, in which the problem of causing poor solderability is overcome and stacked electronic component may withstand abrupt impact of external forces and even thermal shear forces resulted from the thermal expansion coefficient difference between the electronic component and the circuit board.

In accordance with an aspect of the present invention, there is provided a stacked electronic component mounted on a circuit board. The stacked electronic component includes multiple energy storage units and a fastening device. Each of the energy storage units has a first electrode and a second electrode. The fastening device includes a first fastening member and a second fastening member disposed on opposite sides of the energy storage units. Each of the first and second fastening members includes a body plate, at least a pair of clamping structures, each of the clamping structures extending from each edge of the body plate and at least a connecting part electrically connected to the body plate and the circuit board. The energy storage units are clamped by the clamping structures of the first and second fastening members and the first and second electrodes are electrically connected to the body plates of the first and second fastening members, so that the first and second electrodes are electrically connected to the circuit board through the body plates and the connecting parts of the first and second fastening members.

In accordance with another aspect of the present invention, there is provided a fastening device of a stacked electronic component for fastening multiple energy storage units. Each of the energy storage units has a first electrode and a second electrode and is electrically connected to a circuit board through the fastening device. The fastening device includes a first fastening member and a second fastening member disposed on opposite sides of the energy storage units. Each of the first and second fastening members includes a body plate, at least a pair of clamping structures, each of the clamping structures extending from each edge of the body plate and at least a connecting part electrically connected to the body plate and the circuit board. The energy storage units are clamped by the clamping structures of the first and second fastening members and the first and second electrodes are electrically connected to the body plates of the first and second fastening members, so that the first and second electrodes are electrically connected to the circuit board through the body plates and the connecting parts of the first and second fastening members.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
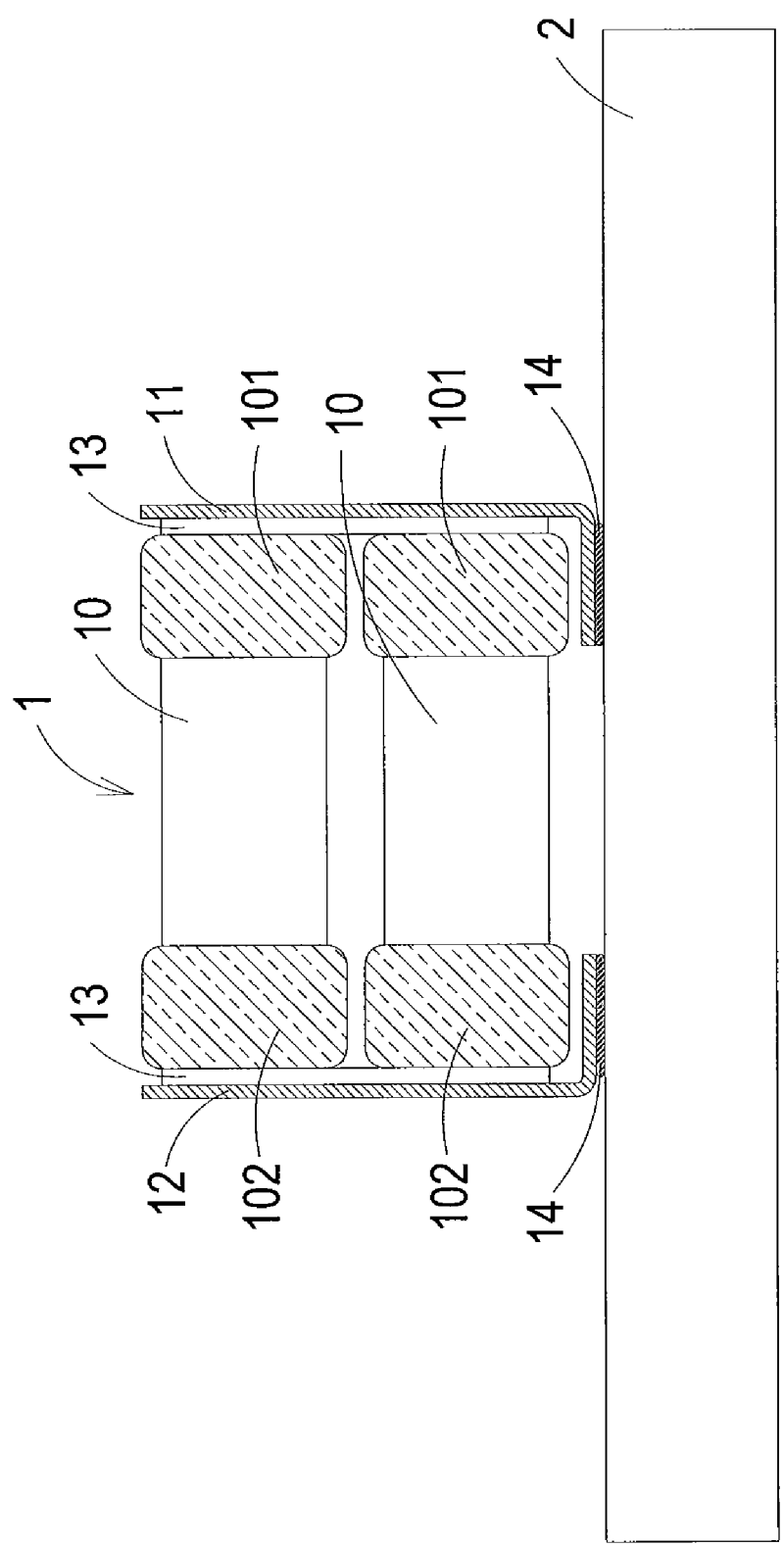
FIG. 1 is a schematic cross-sectional view of a conventional stacked capacitor.
Figure 2A:
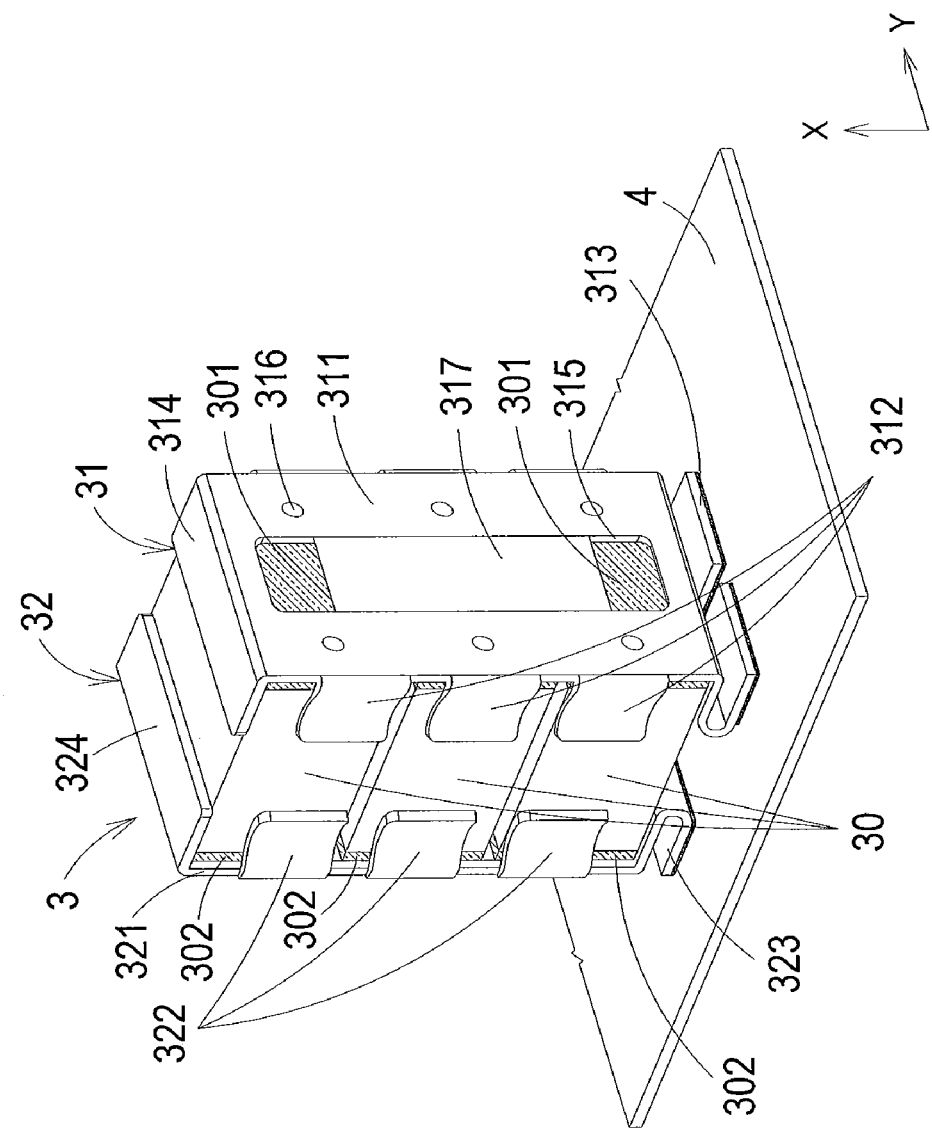
FIG. 2(a) is a schematic perspective view of a stacked electronic component according to a first preferred embodiment of the present invention.

Referring to FIG. 2(a), a schematic perspective view of a stacked electronic component according to a first preferred embodiment of the present invention is illustrated. An exemplary stacked electronic component 3 includes but is not limited to a stacked capacitor such as a ceramic capacitor. The stacked electronic component 3 is disposed on a circuit board 4 and includes three energy storage units 30 for storing energy therein. Each energy storage unit 30 includes a first electrode 301 and a second electrode 302 at bilateral sides thereof. Depending on the users' requirements, the number of the energy storage units 30 included in the stacked electronic component 3 may be varied. Moreover, a fastening device is employed for facilitating clamping the energy storage units 30 and fixing the stacked electronic component 3 on the circuit board 4. The fastening device principally includes a first fastening member 31 and a second fastening member 32, which are symmetrically arranged on bilateral sides of the stacked electronic component 3. Since the energy storage units 30 are clamped by the first fastening member 31 and the second fastening member 32, the energy storage units 30 are assembled in a stacked form on the circuit board 4.

Figure 2B:
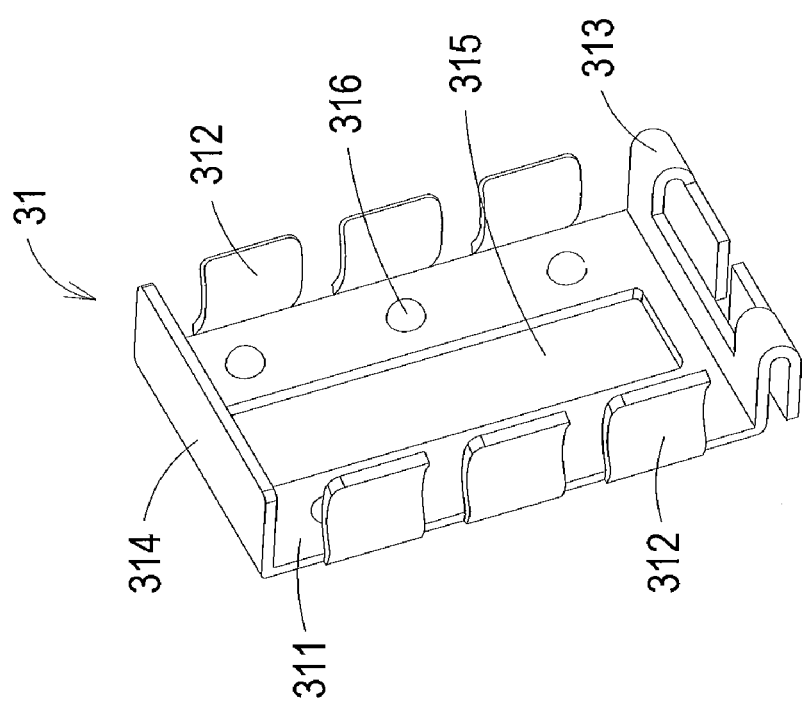
FIG. 2(b) is a schematic perspective view of the first fastening member used with the stacked electronic component of FIG. 2(a)

Since the first fastening member 31 and the second fastening member 32 are substantially identical, only the first fastening member 31 is illustrated with reference to FIG. 2(b) for clarification hereinafter. FIG. 2(b) is a schematic perspective view of the first fastening member 31 used with the stacked electronic component 3 of FIG. 2(a). The first fastening member 31 principally comprises a body plate 311, plural clamping structures 312, a connecting part 313 and an auxiliary part 314. The first fastening member 31 is made of a conductive material such as 42 alloy (a nickel-iron alloy containing 42 wt % Ni), beryllium-copper alloy, phosphor-bronze alloy and the like. In an embodiment, the first fastening member 31 is integrally formed. For forming the first fastening member 31, a metallic plate is partially cut off and then the edge portions are bent upwardly.

Please refer to FIG. 2(b) again. The inner surface of the body plate 311 of the first fastening member 31 is in close contact to the first electrodes 301 of these three energy storage units 30. The body plate 311 is rectangular in shape. The width of the body plate 311 is substantially equal to the width of each energy storage unit 30. The length of the body plate 311 is substantially equal to the overall length of these three energy storage units 30 in a stacked form. The clamping structures 312 are arranged on bilateral sides of the body plate 311 along the stacking direction of the energy storage units 30, i.e. in the X-direction as shown in FIG. 2(a). The clamping structures 312 are bent to be substantially perpendicular to the body plate 311 and have curved surfaces sustained against the energy storage units 30. Due to these curved surfaces, the bilateral sides of the energy storage units 30 are clamped by the clamping structures 312. In this embodiment, the first fastening member 31 includes three pairs of clamping structures 312, which equal to six clamping structures 312. The clamping structures 312 are separated from each other and symmetrically disposed on bilateral sides of the body plate 311 in order to clamp these three energy storage units 30, as is shown in FIG. 2(a). In other words, the number of the clamping structures 312 is two times of the number of the energy storage units 30 and the bilateral sides of each energy storage unit 30 is clamped by two symmetric clamping structures 312.

Please refer to FIGS. 2(a) and 2(b) again. The connecting part 313 is arranged on the bottom side of the first fastening member 31 and perpendicular to the stacking direction of the energy storage units 30, i.e. in the Y-direction as shown in FIG. 2(a). Via the connecting part 313, the body plate 311 is electrically connected to the circuit board 4. In this embodiment, the connecting part 313 includes two bending structures with U-shaped cross-section such that the connecting part 313 is elastically stretchable or shrunk in the Y-direction. As a result, the connecting part 313 may withstand abrupt impact of external forces. Moreover, the auxiliary part 314 is arranged on the top side of the first fastening member 31 and perpendicular to the stacking direction of the energy storage units 30. As a consequence, the top and the bottom of the energy storage units 30 are clamped by the auxiliary part 314 and the connecting part 313.

Referring to FIG. 2(b) again. The body plate 311 further includes a hollow portion 315 in the center thereof. In addition, several contact points 316 are arranged on the body plate 311. The contact points 316 are salient structures to be contacted with the first electrodes 301 of the energy storage units 30. When the energy storage units 30 are clamped by the clamping structures 312 of the first fastening member 31, the contact points 316 are sustained against the first electrodes 301 of the energy storage units 30. Under this circumstance, a gap is formed between the body plate 311 and the first electrodes 301 and the first electrodes 301 are partially exposed from the hollow portion 315 of the body plate 311. Subsequently, a soldering material 317 is molten to be penetrated through the hollow portion 315 to fill the gap between the body plate 311 and the first electrodes 301. After the molten soldering material 317 is solidified, the energy storage units 30 are securely bonded to the body plate 311. Please refer to FIG. 2(a) again. The second fastening member 32 principally comprises a body plate 321, plural clamping structures 322, a connecting part 323 and an auxiliary part 324.

Hereinafter, the process of assembling the stacked electronic component 3 will be illustrated as follows with reference to FIGS. 2(a) and 2(b). First of all, the first fastening member 31 and the second fastening member 32 are symmetrically arranged on bilateral sides of the stacked electronic component 3, such that the energy storage units 30 are clamped by the clamping structures 312 of the first fastening member 31 and the clamping structures 322 of the second fastening member 32. Meanwhile, the contact points are sustained against the first electrodes 301 and the second electrode 302 of the energy storage units 30, and the top and the bottom of the energy storage units 30 are clamped by the auxiliary parts 314, 324 and the connecting parts 313, 323. After the stacked electronic component 3 is fabricated, the connecting parts 313 and 323 are fixed on the circuit board 4 via a soldering material according to a surface mount technology. Since the first fastening member 31 and the second fastening member 32 are made of conductive material, the first electrodes 301 and the second electrodes 302 of the energy storage units 30 are electrically connected to the circuit board 4 through the connecting parts 313 and 323.

Optionally, for facilitating adhesion between the first fastening member 31 and the first electrodes 301 and between the second fastening member 32 and the second electrodes 302, a soldering material is molten to be penetrated through the hollow portions of the body plates 311, 321 to fill the gap between the body plates 311, 321 and the electrodes 301, 302. After the molten soldering material 317 is solidified, the energy storage units 30 are securely bonded to the body plates 311 and 312.

Moreover, the connecting parts 313 and 323 have two bending structures with U-shaped cross-section so as to be elastically stretchable or shrunk in the Y-direction. As a result, the connecting parts 313 and 323 may withstand abrupt impact of external forces and even thermal shear forces resulted from the thermal expansion coefficient difference between the electronic component 3 and the circuit board 4.

In the above embodiment, the energy storage units 30 of the stacked electronic component 3 are clamped by the first fastening member 31 and the second fastening member 32. In addition, the first electrodes 301 and the second electrodes 302 of the energy storage units 30 are electrically connected to the circuit board 4 through the connecting parts 313 and 323.

It is noted that, however, those skilled in the art will readily observe that numerous modifications and alterations of the fastening device may be made while retaining the teachings of the invention.

Figure 3A:
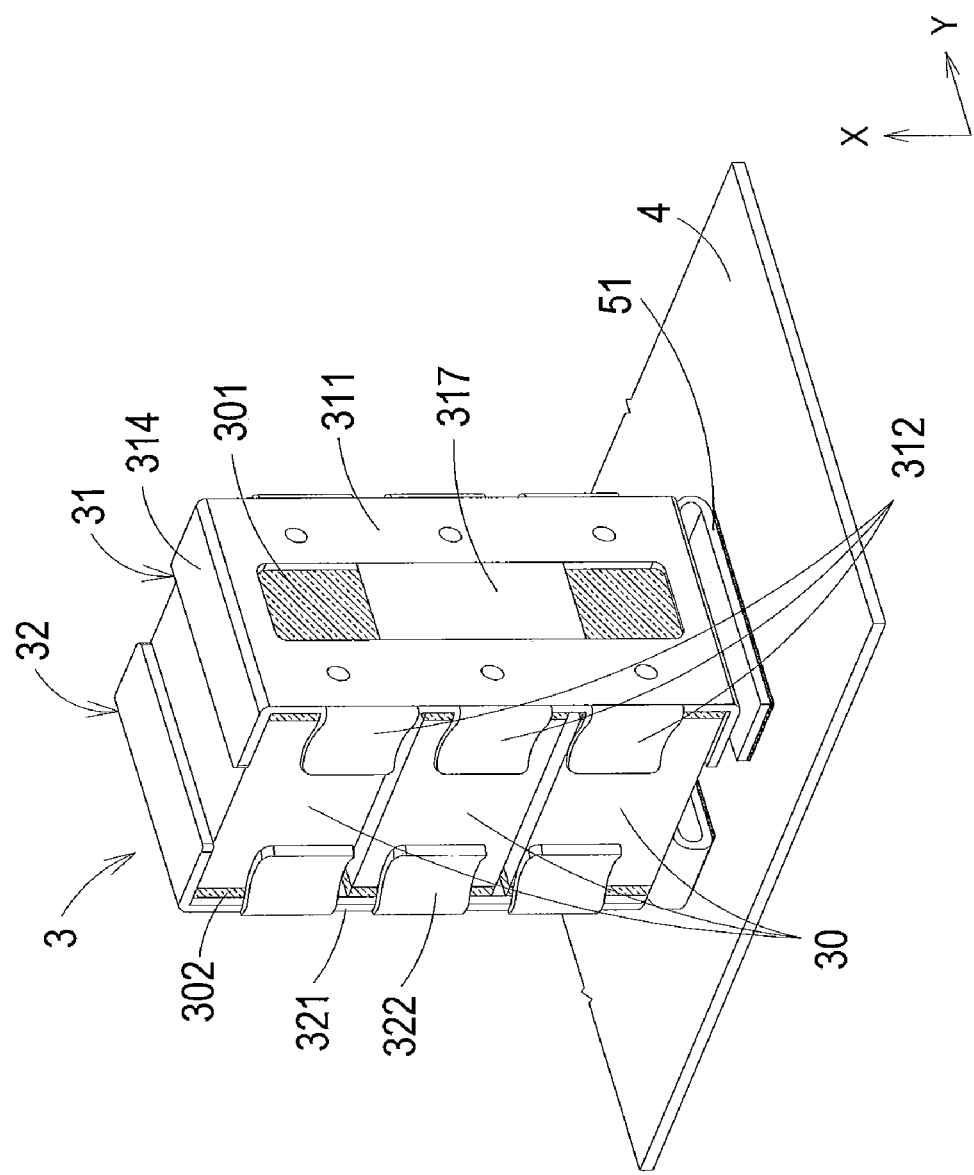
FIG. 3(a) is a schematic perspective view of a stacked electronic component according to a second preferred embodiment of the present invention.
Figure 3B:
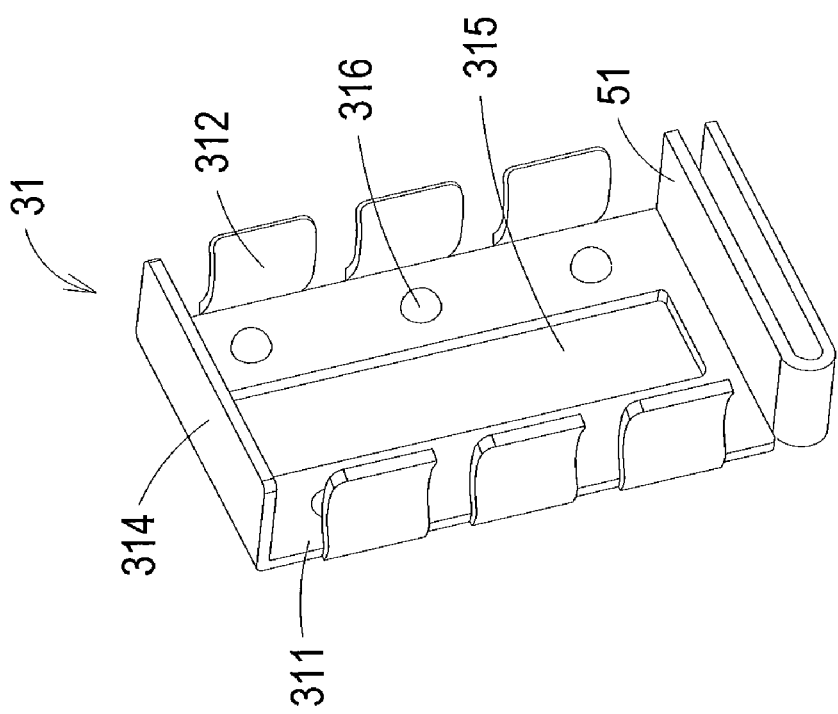
FIG. 3(b) is a schematic perspective view of the first fastening member used with the stacked electronic component of FIG. 3(a)

For example, as shown in FIGS. 3(a) and 3(b), the connecting part 313 of the first fastening member 31 is replaced by another connecting part 51. The connecting part 51 is substantially a single bending structure so to be elastically stretchable or shrunk in the Y-direction.

Figure 4:
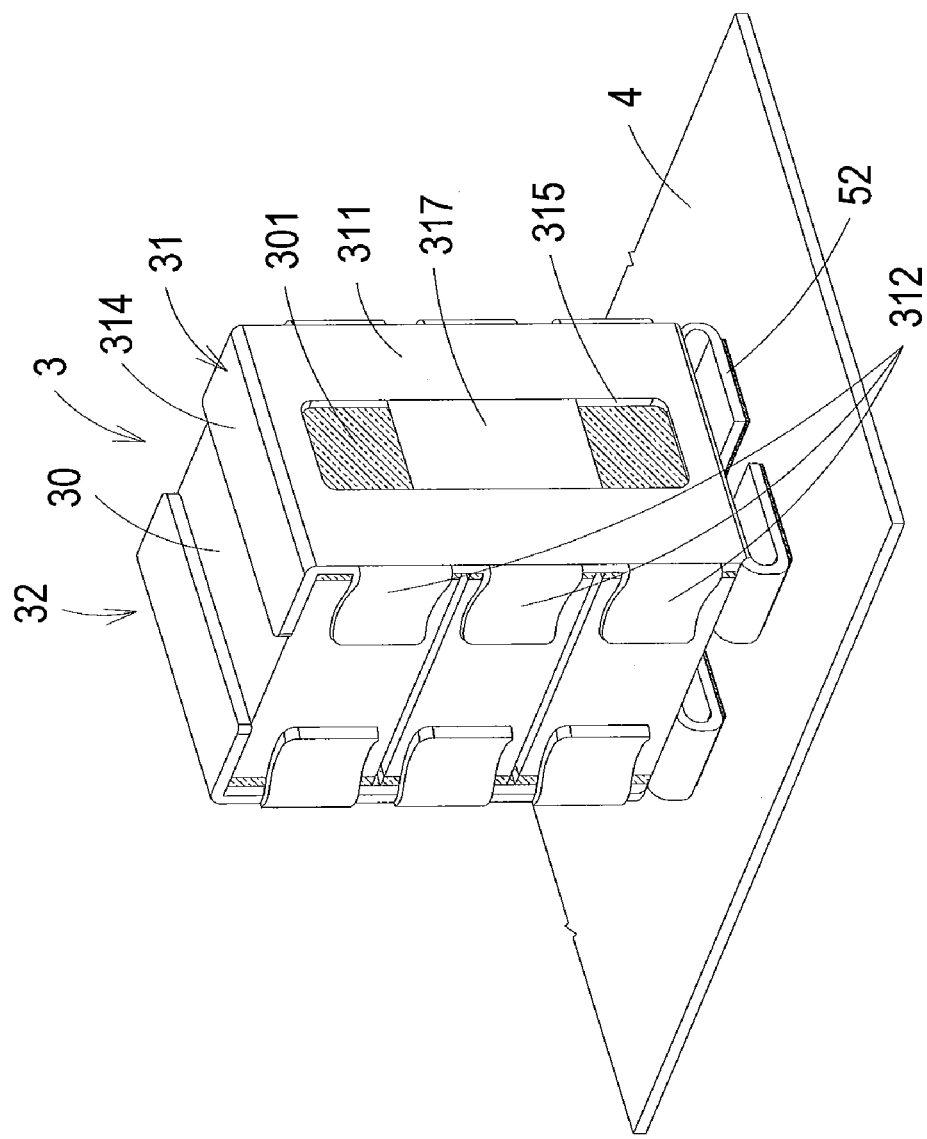
FIG. 4 is a schematic perspective view of a stacked electronic component according to a third preferred embodiment of the present invention.

Moreover, as shown in FIG. 4, the contact points 316 are dispensed with, so that the first electrodes 301 are directly in contact with the body plate 311 of the first fastening member 31. The soldering material 317 is used for facilitating adhesion between the body plate 311 and the first electrodes 301. In addition, the connecting part 52 includes two bending structures with facing to each other.

Figure 5:
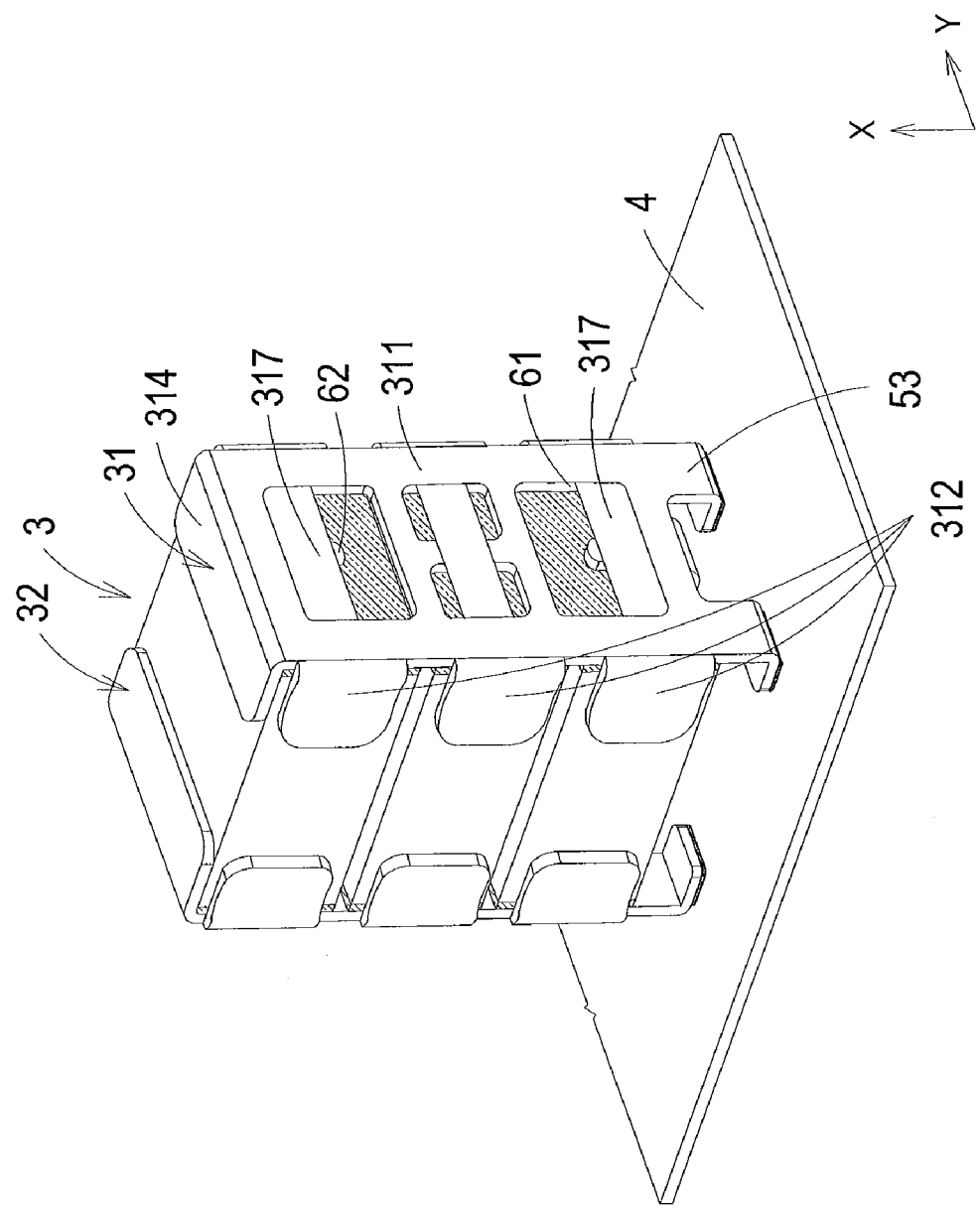
FIG. 5 is a schematic perspective view of a stacked electronic component according to a fourth preferred embodiment of the present invention.

As shown in FIG. 5, the connecting part 53 includes two L-shaped plates extended from the body plate 311. In addition, the body plate 311 has several hollow portions 61 corresponding to the energy storage units 30 and several protrusion structures 62 around the peripheries of the hollow portions 61. The soldering material 317 is used for facilitating adhesion between the body plate 311 and the first electrodes 301. The protrusion structures 62 may increase the contact area between the body plate 311 and the soldering material 317 so as to enhance the welding effect.

Figure 6:
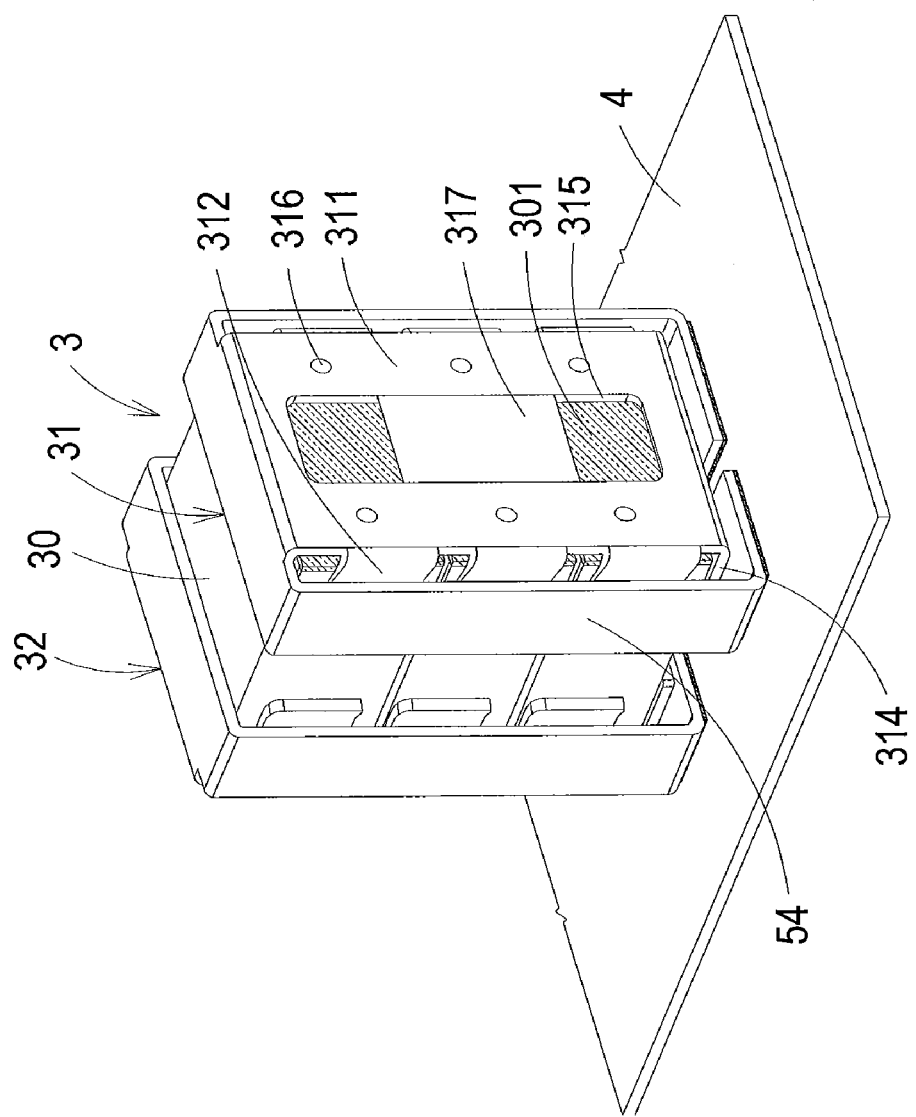
FIG. 6 is a schematic perspective view of a stacked electronic component according to a fifth preferred embodiment of the present invention.

As shown in FIG. 6, the auxiliary part 314 is arranged on the bottom side of the first fastening member 31 and perpendicular to the stacking direction of the energy storage units 30. The connecting part 54 includes two L-shaped plates extending from the top side of the body plate 311 so as to partially enclose the clamping structures 312 and be sustained against the clamping structures 312. As a result, the connecting part 54 facilitates the clamping structures 312 to strongly clamp the energy storage units 30.

Figure 7:
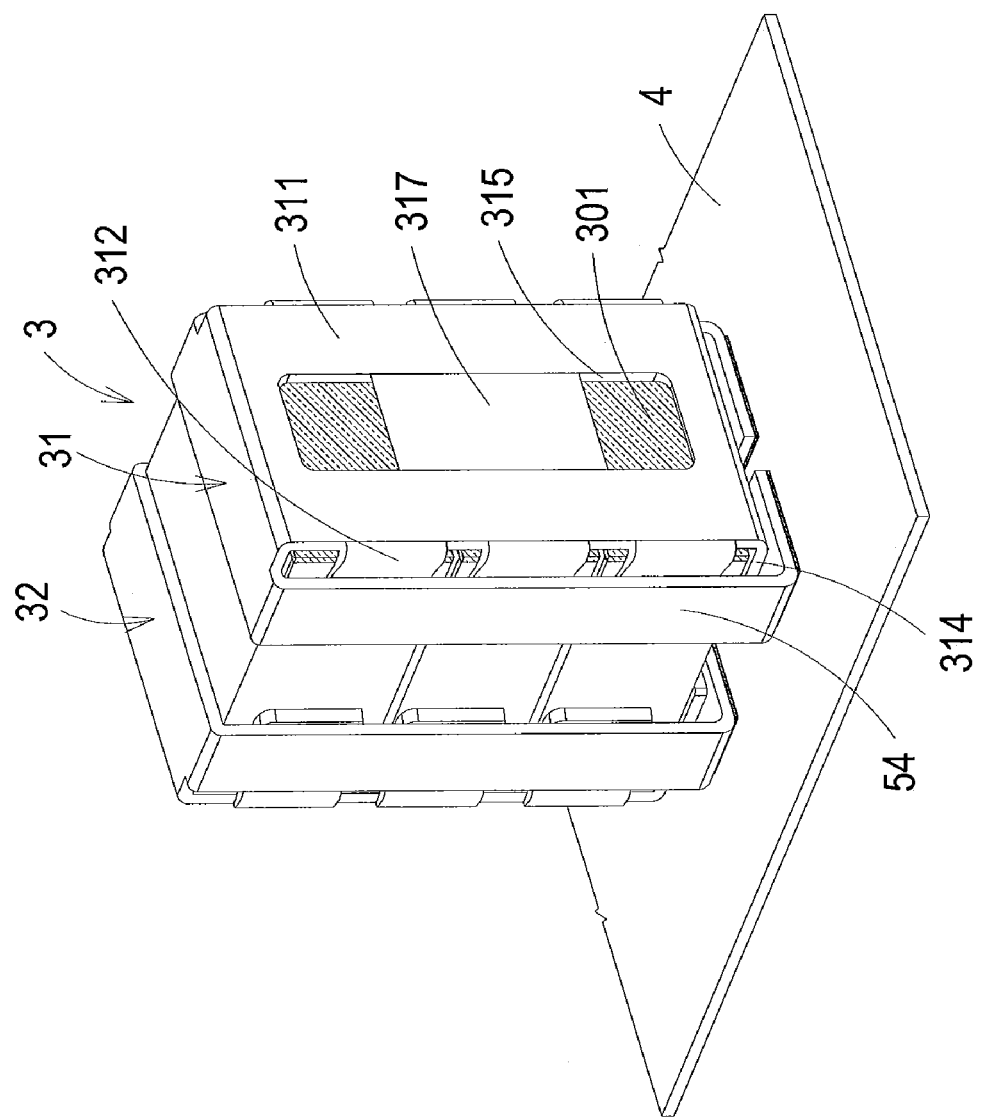
FIG. 7 is a schematic perspective view of a stacked electronic component according to a sixth preferred embodiment of the present invention.

The stacked electronic component 3 included in FIG. 7 is substantially identical to that of FIG. 6 except that the contact points 316 are dispensed with. Under this circumstance, the first electrodes 301 are directly in contact with the body plate 311 of the first fastening member 31 and soldering material 317 is used for facilitating adhesion between the body plate 311 and the first electrodes 301.

In the above embodiments of FIGS. 3~7, the clamping structures 312 are separated from each other and symmetrically disposed on bilateral sides of the body plate 311 in order to clamp the energy storage units 30. It is noted that, however, those skilled in the art will readily observe that numerous modifications and alterations of the clamping structures may be made while retaining the teachings of the invention.

A further embodiment of a stacked electronic component according to the present invention is illustrated with reference to FIG. 8. The stacked electronic component 3 includes three energy storage units 30 and a fastening device. The fastening device principally includes a first fastening member 71 and a second fastening member 72, which are symmetrically arranged on bilateral sides of the stacked electronic component 3. The first fastening member 71 comprises a body plate 711, a pair of clamping structures 712 and a connecting part 713. The body plate 711 is in contact with the first electrodes 301 of the energy storage units 30. The body plate 711 further includes a hollow portion 714 in the center thereof. The first electrodes 301 are partially exposed from the hollow portion 714 of the body plate 711. The soldering material 317 is used for facilitating adhesion between the body plate 711 and the first electrodes 301. In this embodiment, the pair of clamping structures 712 includes two plate structures perpendicular to the top side and the bottom side of the body plate 711 for clamping the energy storage units 30 therebetween. The connecting part 713 includes two L-shaped plates perpendicularly and downwardly extending from the top side of one of the clamping structure 712. The connecting part 713 may facilitate fixing the energy storage units 30 at the bilateral sides thereof. After the stacked electronic component 3 is fabricated, the connecting part 713 is fixed on the circuit board 4 via a soldering material according to a surface mount technology.

Figure 8:
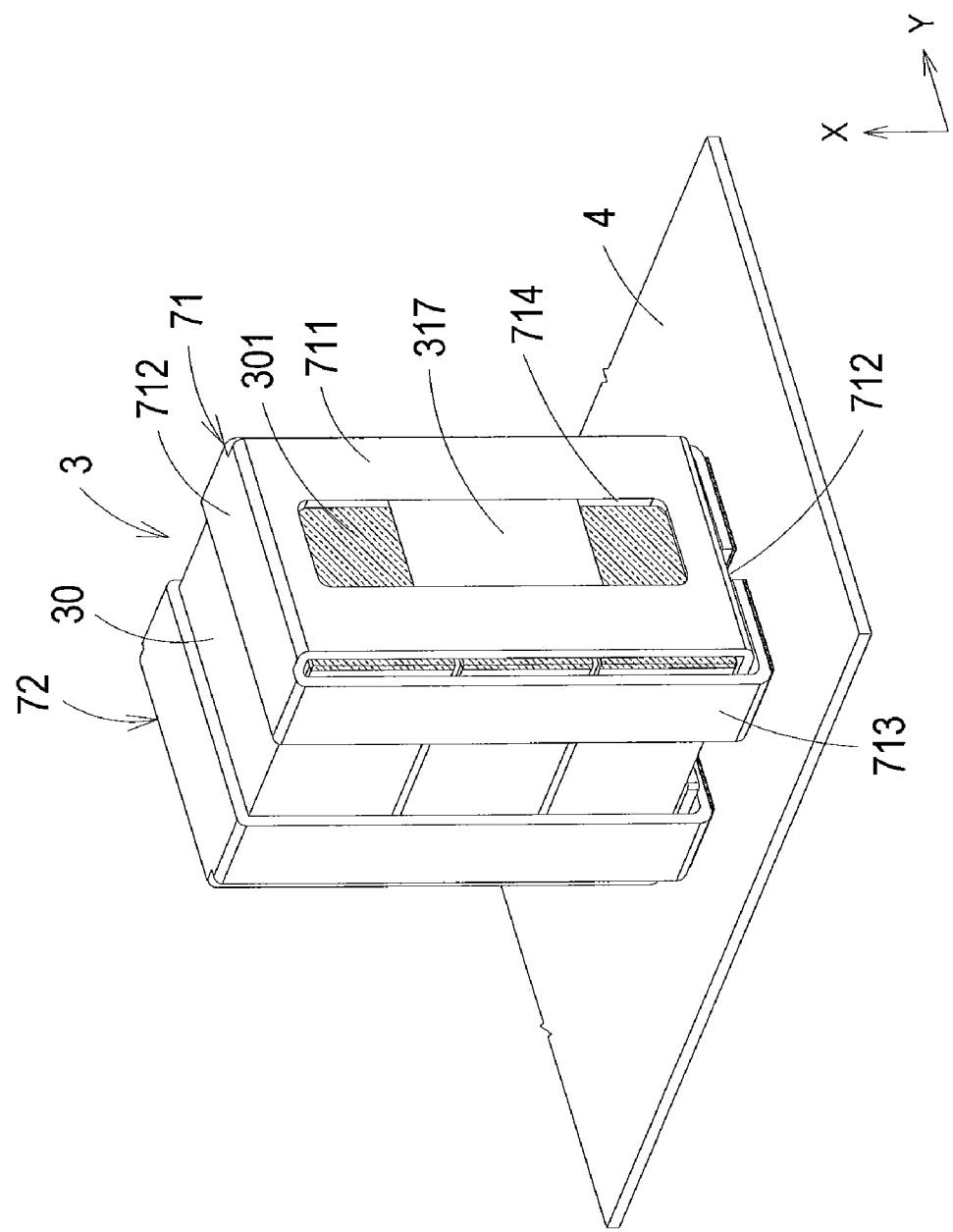
FIG. 8 is a schematic perspective view of a stacked electronic component according to a seventh preferred embodiment of the present invention.
Figure 9:
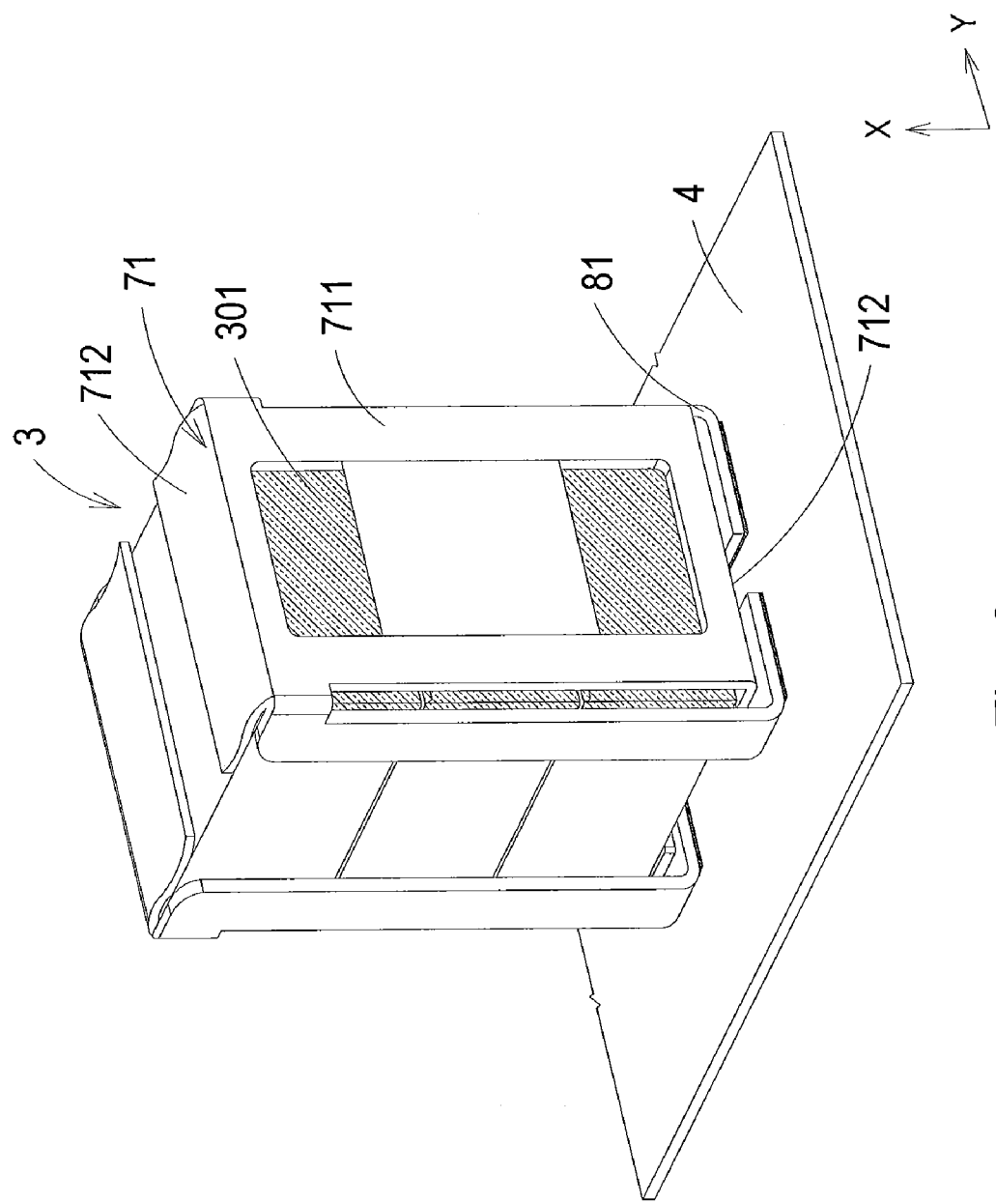
FIG. 9 is a schematic perspective view of a stacked electronic component according to an eighth preferred embodiment of the present invention.

The stacked electronic component 3 included in FIG. 9 is substantially identical to that of FIG. 8 except that each of the clamping structures 712 has a curved surface in order to increase the clamping force. In addition, the connecting part 82 is separated from the clamping structure 712.

Figure 10:
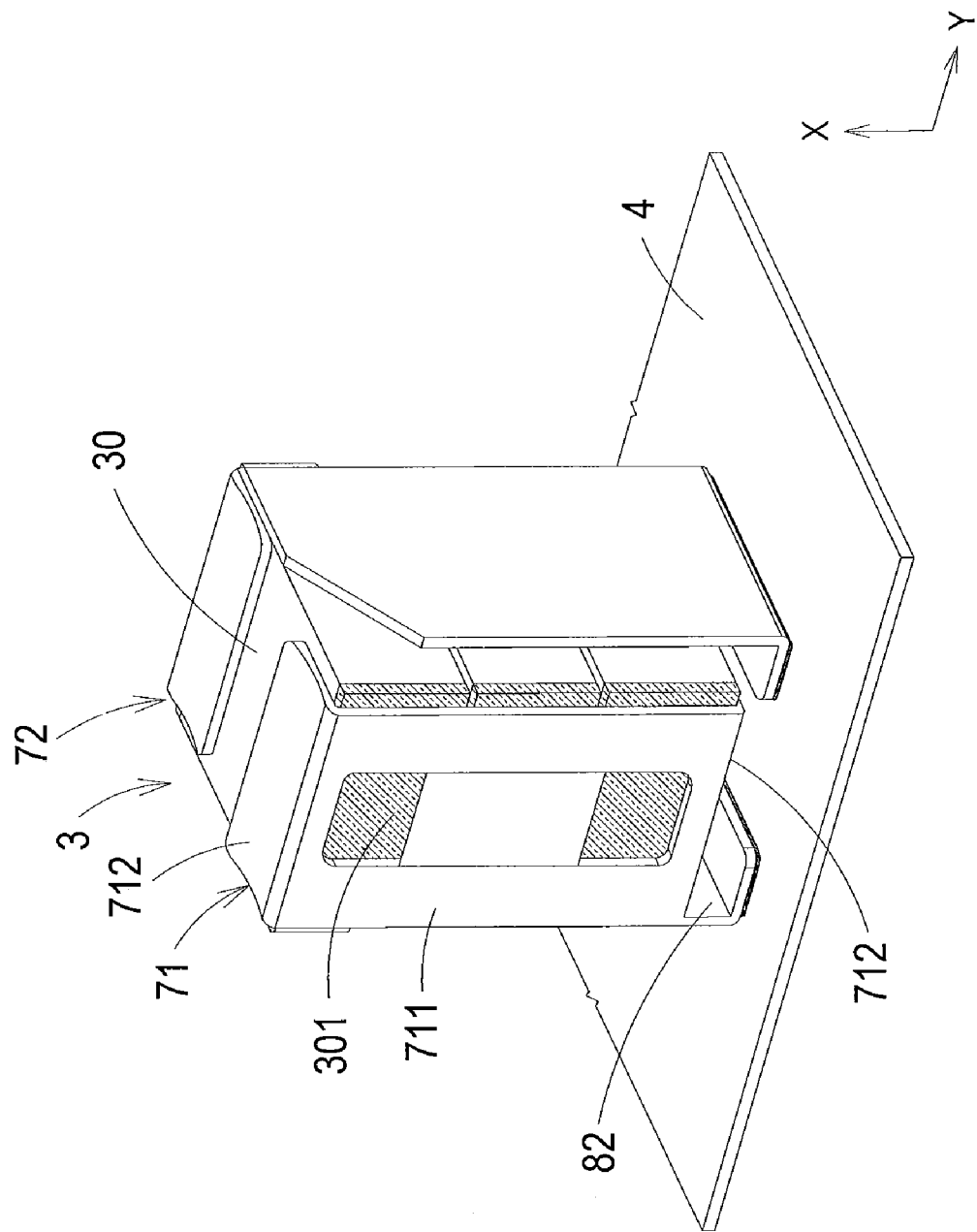
FIG. 10 is a schematic perspective view of a stacked electronic component according to a ninth preferred embodiment of the present invention.

The stacked electronic component 3 included in FIG. 10 is substantially identical to that of FIG. 9 except that the connecting part 82 shelters most area of the energy storage units 30 at both sides next to the electrodes 301 and 302.

The above embodiments are variants of the fastening devices. In the embodiments of FIGS. 2(a), 3(a) and 6, the first fastening member and the second fastening member have contact points. In the embodiments of FIGS. 2(a), 8 and 10, the locations of the clamping structures are different. In the embodiments of FIGS. 2(a), 3(a), 4, 5, 6, 9 and 10, the connecting parts have diversified forms. The present invention is not limited to these variants of the fastening devices as long as the energy storage units are clamped by the clamping structures, the electrodes of the energy storage units are electrically connected to the body plates, and the connecting parts are electrically connected to the circuit board.

As previously described, the electrodes of the energy storage units need to be welded to the metallic terminals in the prior art, and the welding effect is usually undesired if the electrodes are not precisely aligned with the metallic terminals. In contrast, according to the present invention, since the energy storage units are clamped by the first fastening member and the second fastening member of the fastening device, the problem of causing poor solderability is overcome and the process of mounting the stacked electronic component on the circuit board is simplified. Moreover, since the connecting parts are elastically stretchable or shrunk in the Y-direction, the connecting parts may withstand abrupt impact of external forces and even thermal shear forces resulted from the thermal expansion coefficient difference between the electronic component and the circuit board.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A stacked electronic component mounted on a circuit board, said stacked electronic component comprising:
multiple energy storage units, each of which having a first electrode and a second electrode; and
a fastening device including a first fastening member and a second fastening member disposed on opposite sides of said energy storage units, each of said first and second fastening members comprising a body plate, at least a pair of clamping structures, each of said clamping structures extending from each edge of said body plate and at least a connecting part electrically connected to said body plate and said circuit board, wherein said energy storage units are clamped by said clamping structures of said first and second fastening members and said first and second electrodes are electrically connected to said body plates of said first and second fastening members, so that said first and second electrodes are electrically connected to said circuit board through said body plates and said connecting parts of said first and second fastening members.

2. The stacked electronic component according to claim 1 wherein said body plate, said clamping structures and said connecting part of said first fastening member are integrally formed, and said body plate, said clamping structures and said connecting part of said second fastening member are integrally formed.

3. The stacked electronic component according to claim 1 wherein said clamping structures have curved surfaces sustained against the energy storage units so as to facilitate claming said energy storage units.

4. The stacked electronic component according to claim 1 wherein said body plates include hollow portions to expose said first and second electrodes, wherein a soldering material is penetrated through said hollow portions for enhancing adhesion between said body plates and said first and second electrodes.

5. The stacked electronic component according to claim 1 wherein said body plates include contact points sustained against said first and second electrodes.

6. The stacked electronic component according to claim 1 wherein said connecting parts include bending structures such that said connecting parts are elastically stretchable or shrunk along the stacking direction.

7. The stacked electronic component according to claim 1 wherein said stacked electronic component is a stacked capacitor.

8. The stacked electronic component according to claim 7 wherein said stacked capacitor is a ceramic stacked capacitor.

9. The stacked electronic component according to claim 1 wherein said first and second fastening members are made of a conductive material.

10. The stacked electronic component according to claim 9 wherein said conductive material is nickel-iron alloy, beryllium-copper alloy, or phosphor-bronze alloy.

11. The stacked electronic component according to claim 1 wherein said first and second fastening members include multiple separated clamping structures for clamping respective energy storage units.

12. The stacked electronic component according to claim 11 wherein the number of said clamping structures is two times of the number of said energy storage units and the bilateral sides of each energy storage unit is clamped by two symmetric clamping structures.

13. A fastening device of a stacked electronic component for fastening multiple energy storage units, each of said energy storage units having a first electrode and a second electrode and electrically connected to a circuit board through said fastening device, said fastening device comprising a first fastening member and a second fastening member disposed on opposite sides of said energy storage units, each of said first and second fastening members comprising:
a body plate;
at least a pair of clamping structures, each of said clamping structures extending from each edge of said body plate; and
at least a connecting part electrically connected to said circuit board, wherein said energy storage units are clamped by said clamping structures of said first and second fastening members and said first and second electrodes are electrically connected to said body plates of said first and second fastening members, so that said first and second electrodes are electrically connected to said circuit board through said body plates and said connecting parts of said first and second fastening members.

14. The fastening device according to claim 13 wherein said stacked electronic component is a stacked capacitor.

15. The fastening device according to claim 13 wherein said first and second fastening members are made of a conductive material selected from nickel-iron alloy, beryllium-copper alloy, or phosphor-bronze alloy.

16. The fastening device according to claim 13 wherein said body plate, said clamping structures and said connecting part of said first fastening member are integrally formed, and said body plate, said clamping structures and said connecting part of said second fastening member are integrally formed.

17. The fastening device according to claim 13 wherein said first and second fastening members include multiple separated clamping structures for clamping respective energy storage units, wherein the number of said clamping structures is two times of the number of said energy storage units and the bilateral sides of each energy storage unit is clamped by two symmetric clamping structures.

18. The fastening device according to claim 13 wherein said clamping structures have curved surfaces sustained against the energy storage units so as to facilitate claming said energy storage units.

19. The fastening device according to claim 13 wherein said body plates include hollow portions to expose said first and second electrodes, wherein a soldering material is penetrated through said hollow portions for enhancing adhesion between said body plates and said first and second electrodes.

20. The fastening device according to claim 13 wherein said body plates include contact points sustained against said first and second electrodes, and said connecting parts include bending structures such that said connecting parts are elastically stretchable or shrunk along the stacking direction.

* * * * *